United States Patent
Seo

(10) Patent No.: US 7,071,027 B2
(45) Date of Patent: Jul. 4, 2006

(54) BALL GRID ARRAY PACKAGE HAVING IMPROVED RELIABILITY AND METHOD OF MANUFACTURING THE SAME

(75) Inventor: Jeong-Woo Seo, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 10/741,439

(22) Filed: Dec. 22, 2003

(65) Prior Publication Data

US 2004/0147060 A1 Jul. 29, 2004

(30) Foreign Application Priority Data

Jan. 29, 2003 (KR) .................. 10-2003-0005935

(51) Int. Cl.
  *H01L 21/44* (2006.01)
  *H01L 21/48* (2006.01)
  *H01L 21/50* (2006.01)
(52) U.S. Cl. .................. 438/106; 438/127; 438/458
(58) Field of Classification Search ............ 438/106, 438/107, 108, 117, 118, 127, 458, 464
  See application file for complete search history.

(56) References Cited

U.S. PATENT DOCUMENTS 6,404,214 B1 * 6/2002 Muramatsu et al. ........ 324/754
6,483,191 B1 * 11/2002 Umezaki .................... 257/738
6,576,984 B1 * 6/2003 Takahashi et al. .......... 257/668
2002/0056561 A1 * 5/2002 Yaguchi et al. ............ 174/52.1
2002/0079575 A1 * 6/2002 Hozoji et al. ............... 257/734

FOREIGN PATENT DOCUMENTS

| KR | 10-2000-0076871 A | 12/2000 |
| KR | 2001-0061888 | 7/2001 |
| KR | 10-2002-0034958 A | 5/2002 |
| KR | 2002-34958 | 5/2002 |

OTHER PUBLICATIONS

Korean Office Action dated Oct. 10, 2005 for Korean Application No. 10-2003-000005935 (Complete English translation provided).
Korean Patent Office Action dated Dec. 18, 2004, KR Appl. No. 10-2003-0005935 (with English language translation).

* cited by examiner

*Primary Examiner*—Phuc T. Dang
(74) *Attorney, Agent, or Firm*—Harness, Dickey & Pierce

(57) ABSTRACT

A ball grid array package utilizing a layer of an elastic insulating material to protect conductive ball lands from deformation during subsequent processing and use of the resulting device and a method of manufacturing the same are disclosed. The elastic insulating layer preferably has a modulus of elasticity no greater than about 20 MPa or less to absorb and or distribute mechanical stress applied to conductive ball lands directly or through solder ball joints or other structures and thereby improve the solder joint reliability (SJR) of the resulting device.

20 Claims, 4 Drawing Sheets

BALL GRID ARRAY PACKAGE HAVING IMPROVED RELIABILITY AND METHOD OF MANUFACTURING THE SAME

CROSS-REFERENCE TO RELATED APPLICATIONS

This application claims the priority of Korean Patent Application No. 2003-5935, filed on Jan. 29, 2003, in the Korean Intellectual Property Office, the disclosure of which is incorporated herein in its entirety by reference.

BACKGROUND OF THE INVENTION

1. Field of the Invention

The present invention relates to semiconductor packages and methods of manufacturing semiconductor packages and, more particularly, relates to a ball grid array (BGA) package and a method of manufacturing such a package.

2. Description of the Related Art

Ball grid array (BGA) packages are used for mounting of and making electrical connections to semiconductor chips. FIG. 1 is a cross-sectional view of a conventional BGA package 30. As illustrated in FIG. 1, the BGA package 30 includes a semiconductor chip 31 mounted on a top surface of a substrate 33 via an adhesive 32. The exposed top surfaces of the semiconductor chip 31 and the substrate 33 are encapsulated and protected by a mold resin 36. Solder balls 35 formed on a bottom surface of the substrate 33 are attached to conductive ball lands 34a and 34b.

In the BGA package 30, the surfaces of the conductive ball lands 34a and 34b are in direct contact with the adhesive 32 or the mold resin 36 respectively. Because both the adhesive 32 and the mold resin 36 typically have a high modulus of elasticity, when the BGA package 30 is mounted on a printed circuit board (PCB) made of, for example, an epoxy-glass material, the solder balls 35 are subjected to shearing stresses applied to the joints resulting from differences in the coefficient of thermal expansion between the PCB and the solder balls 35. Overtime, these shearing stresses tend to degrade the solder joint reliability (SJR) of the resulting device.

Further, as shown in FIG. 1, the conductive ball lands 34b in contact with the mold resin 36 may be bent downwardly or otherwise deformed as a result of the high pressure applied as the mold resin 36 is cast. If the conductive ball lands 34b are deformed, the SJR of the resulting device will typically be degraded further.

SUMMARY OF THE INVENTION

The present invention provides exemplary embodiments of ball grid array (BGA) packages in which the deformation of the conductive ball lands is reduced or prevented and which will tend to exhibit improved solder joint reliability (SJR) as a result. The present invention also provides exemplary methods for manufacturing BGA packages in which the deformation of the conductive ball lands may be reduced.

An exemplary embodiment of the present invention provides a BGA package comprising a substrate; a bond finger formed on a top surface of the substrate; a plurality of conductive ball lands formed on the top surface of the substrate; an elastic insulating layer coated on the conductive ball lands; a solder ball formed on a bottom surface of the substrate and attached to the conductive ball lands through openings extending through the substrate; a semiconductor chip mounted on the substrate; a connection member which electrically connects a bonding pad provided on the semiconductor chip to the bond fingers; and a mold resin encapsulating the semiconductor chip, the bond finger, the conductive ball lands and the connection member.

Another exemplary embodiment of the present invention provides a method of manufacturing a BGA package including preparing a substrate; forming a bond finger and a plurality of conductive ball lands on a top surface of the substrate; forming an elastic insulating layer that coats the conductive ball lands; mounting a semiconductor chip on the substrate; electrically connecting a bonding pad on the semiconductor chip to the bond finger through a connection member; encapsulating the semiconductor chip, the bond finger, the plurality of conductive ball lands and the connection member with a mold resin; and attaching a solder ball to the respective conductive ball lands through openings extending through the substrate.

BRIEF DESCRIPTION OF THE DRAWINGS

The aspects and advantages of the present invention will become more apparent by describing in detail exemplary embodiments of the invention with reference to one or more of the attached drawings in which.

DETAILED DESCRIPTION OF THE INVENTION

The present invention will now be described more fully with reference to the accompanying drawings, in which certain exemplary embodiments of the invention are shown. Those of ordinary skill in the art will, however, appreciate that the present invention may be embodied in many different forms and should therefore not be construed as being limited to the particular exemplary embodiments described and illustrated herein. These exemplary embodiments are provided, however, so that the present disclosure will be thorough and complete and will fully convey the concept of the invention to those of ordinary skill in the art.

Figure 1:
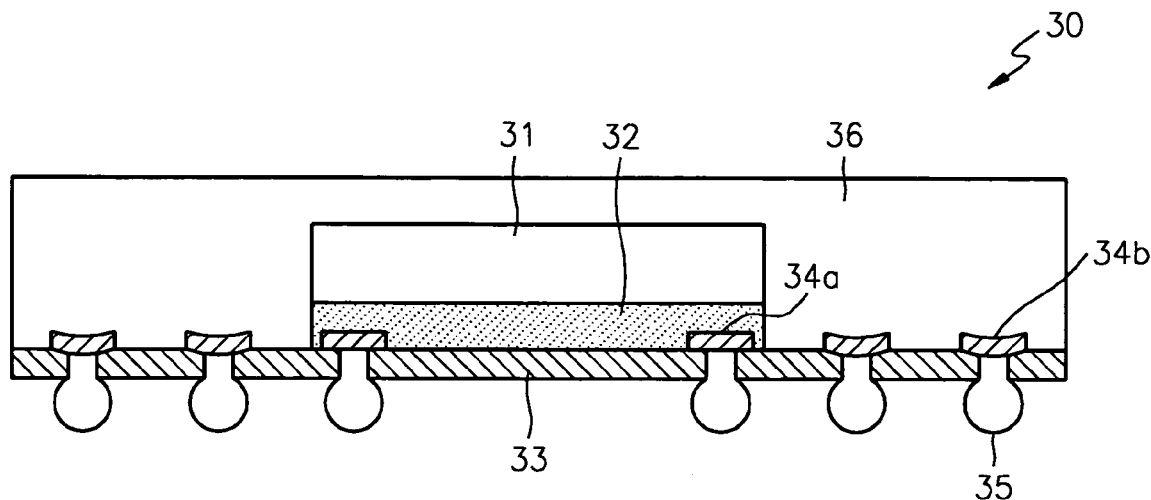
FIG. 1 is a cross-sectional view of a conventional ball grid array (BGA) package showing the deformation of a conductive ball land.
Figure 2:
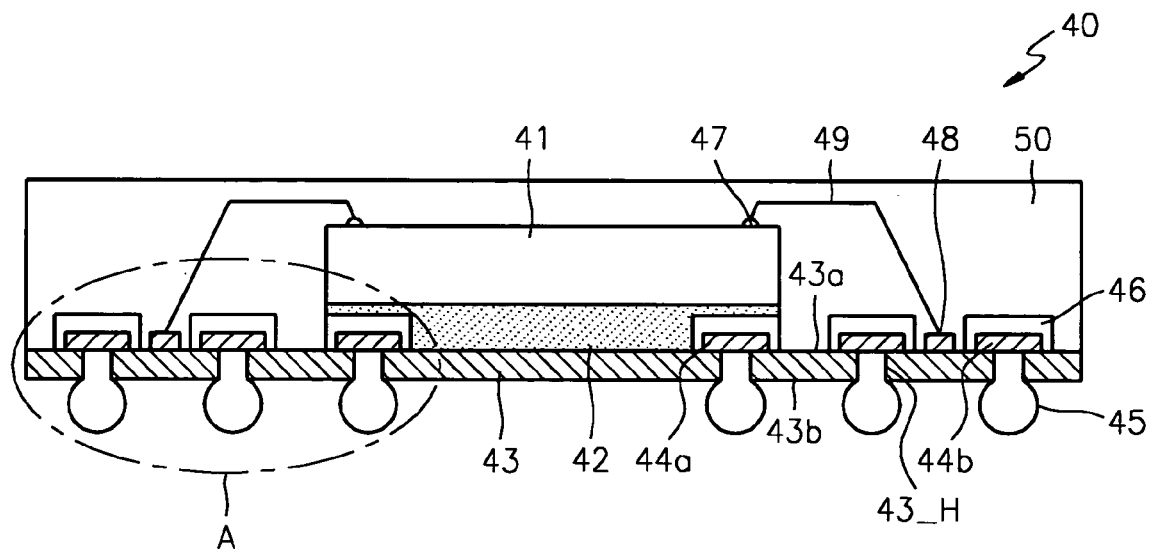
FIG. 2 is a cross-sectional view of a BGA package according to a first exemplary embodiment of the present invention.

FIG. 2 is a cross-sectional view of a BGA package 40 according to a first exemplary embodiment of the present invention. As shown in FIG. 2, bond fingers 48 and conductive ball lands 44a and 44b are formed on a top surface 43a of an substrate 43 formed from an insulating material. A variety of insulating materials may be used singly or in combination to form the substrate 43 including insulating tape materials of a polymeric material such as polyimide and/or epoxy-based resins.

The bond fingers 48 and the conductive ball lands 44a and 44b are typically formed from a conductive metal such as copper (Cu). The bond fingers 48 and conductive ball lands 44a and 44b may also include a surface coating including one or more layers of compatible corrosion suppressing materials such as Ni, Au and Ag.

Solder balls 45 formed on a bottom surface 43b of the substrate 43 are electrically connected to corresponding ones of the conductive ball lands 44a and 44b formed on the top surface 43a of the substrate 43 through openings 43_H that extend through the substrate from the bottom surface 43b to the top surface 43a of the substrate 43.

The upper and side surfaces of the conductive ball lands 44a and 44b are coated with elastic insulating layers 46. The elastic insulating layers 46 are made from one or more materials having properties that allow the elastic insulating layers to absorb and distribute stresses induced as the solder balls 45 press against the conductive ball lands 44a and 44b. Elastomers, materials which occupy an intermediate state between plastic and rubber are suitable materials for forming the elastic insulating layers. Preferably, the elastic insulating layers 46 are made of one or more elastomeric materials having a low modulus of elasticity (Young's modulus) of less than about 20 MPa as determined using DMA (Dynamic Mechanical Analysis) equipment.

An example of a material having a modulus of elasticity of 20 MPa or less is a silicone-based resin. While the modulus of elasticity of an epoxy-based resin is about 60 MPa at a temperature of 25° C., the modulus of elasticity of the preferred silicone-based resin is about 5–10 MPa at the same temperature. It is preferred that the thickness of the elastic insulating layers 46 be within a range of about 20–100 μm (as measured on pilot wafers) for use with typical device and substrate configurations. The uniformity of the elastic insulating layers 46 may also be evaluated using pilot wafers having both insulating and non-insulating regions formed on their surfaces. If the elastic insulating layers 46 are too thin, e.g., less than about 20 μm, they may be insufficient to absorb and distribute the stress imposed on the joints of the solder balls 45. Conversely, if the elastic insulating layers 46 are too thick, e.g., more than about 100 μm, the stability of the manufacturing process and the solder joint reliability (SJR) may be degraded.

As illustrated in FIG. 2, semiconductor chip 41 is mounted on a predetermined area of the top surface 43a of the substrate 43 via an adhesive 42. Bonding pads 47 of the semiconductor chip 41 and corresponding bond fingers 48 may be electrically connected through an electrical connection member, for example, bond wires 49. The semiconductor chip 41, the bond fingers 48, the bond wires 49, and the conductive ball lands 44a and 44b are then encapsulated by a mold resin 50 and thereby protected from the external environment.

The conductive ball lands 44a, which may be disposed in a fan-in position, i.e., within the predetermined area on which the semiconductor chip 41 is mounted, contact the adhesive 42, and the conductive ball lands 44b, which are disposed in a fan-out position, i.e., outside the periphery of the predetermined area on which the semiconductor chip 41 is mounted, contact the mold resin 50. By coating conductive ball lands 44b with the elastic insulating layers 46 in the BGA package 40, even if high filling pressures are applied as the mold resin 50 is molded, the deformation of conductive ball lands 44b may be reduced or eliminated. Further, by coating the conductive ball lands 44a with the elastic insulating layers 46, they can be protected from contact with adhesive 42. As a result, even if the adhesive 42 and the mold resin 50 are hardened, the elastic insulating layers 46 remain in place and sufficiently flexible to absorb and/or distribute the shearing stresses applied to the ball lands by the solder ball joints as a result of differences in the coefficient of thermal expansion between a printed circuit board (PCB) (not shown) and the solder balls 45 during the mounting of the BGA package 40 on the PCB and during subsequent device operation, thereby improving the solder joint reliability (SJR) of the BGA package.

Figure 3:
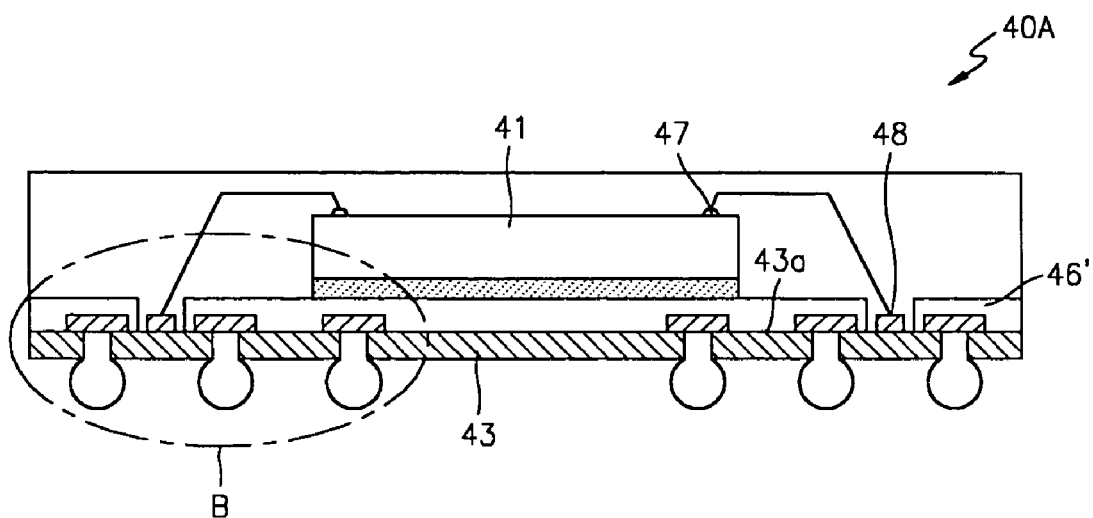
FIG. 3 is a cross-sectional view of a BGA package according to a second exemplary embodiment of the present invention.

FIG. 3 is a cross-sectional view of a BGA package 40A according to a second exemplary embodiment of the present invention which differs from the first exemplary embodiment in that elastic insulating layers 46' are formed on substantially the entire top surface 43a of the substrate 43, the exception being the regions underneath and adjacent to the bond fingers 48 which are electrically connected to bonding pads 47 of a semiconductor chip 41. Because the other components of the BGA device 40A illustrated in FIG. 3 correspond to the components described with respect to the first exemplary embodiment, the description of these components will not be repeated here.

Figure 4:
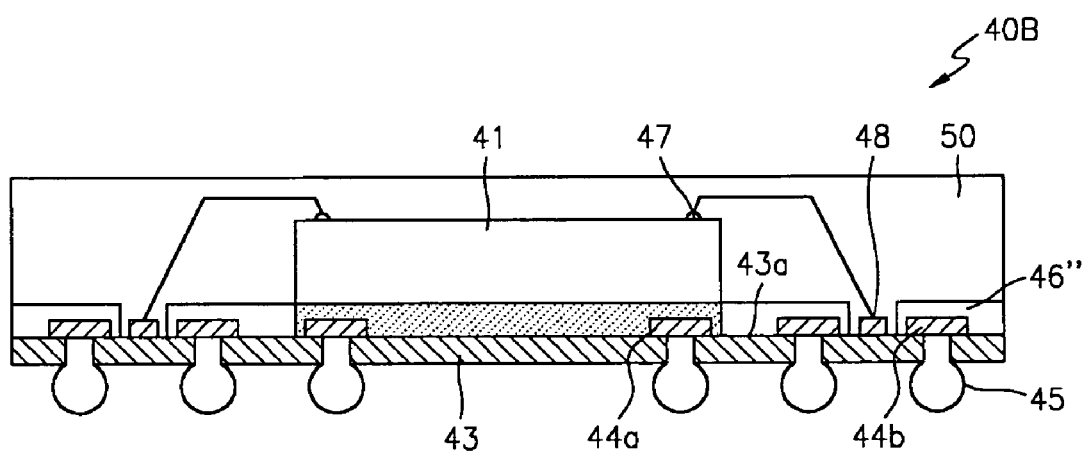
FIG. 4 is a cross-sectional view of a BGA package according to a third exemplary embodiment of the present invention.

FIG. 4 is a cross-sectional view of a BGA package 40B according to a third exemplary embodiment of the present invention which differs from the BGA package 40 described in connection with the first exemplary embodiment in that elastic insulating layers 46" are coated on those portions of the top surface 43a of the substrate 43 that are not covered by or adjacent the bond fingers 48 which are electrically connected to bonding pads 47 of the semiconductor chip 41 and those portions of the top surface within the predetermined area on which the semiconductor chip 41 is mounted, i.e., the fan-in area.

The conductive ball lands 44b disposed in a fan-out position are more susceptible to deformation by the pressure applied during the formation of the mold resin 50 encapsulation than the conductive ball lands 44a that are disposed in a fan-in position and protected, at least partially, by the semiconductor chip 41. In light of this increased susceptibility, in this embodiment the elastic insulating layers 46" are formed only on the conductive ball lands 44b in the fan-out position of the BGA package 40B. By not forming elastic insulating layers in the fan-in area, this modification allows the BGA package 40B to exhibit a reduced thickness when compared with the corresponding BGA packages 40 and 40A as illustrated in FIGS. 2 and 3. Because the other components of the BGA device 40B illustrated in FIG. 4 correspond to the components described with respect to the first exemplary embodiment, the description of these components will not be repeated here.

Figure 5:
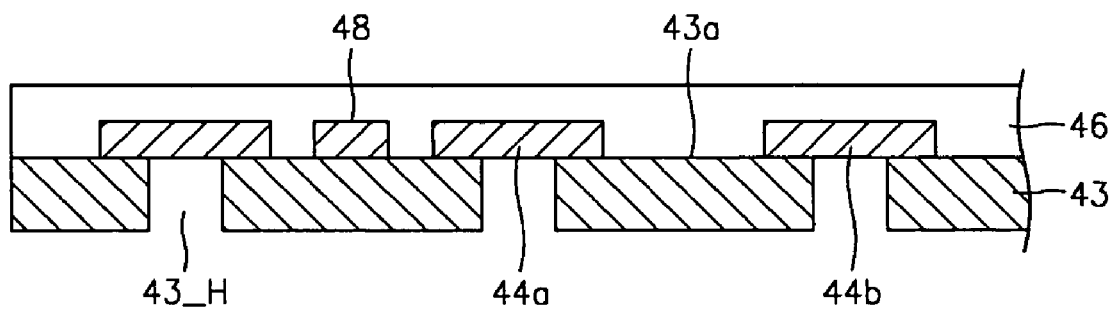
FIGS. 5 through 7 are enlarged cross-sectional views of a portion A of FIG. 2 for explaining a first exemplary method of manufacturing a BGA package according to the first exemplary embodiment as illustrated in FIG. 2.
Figure 6:
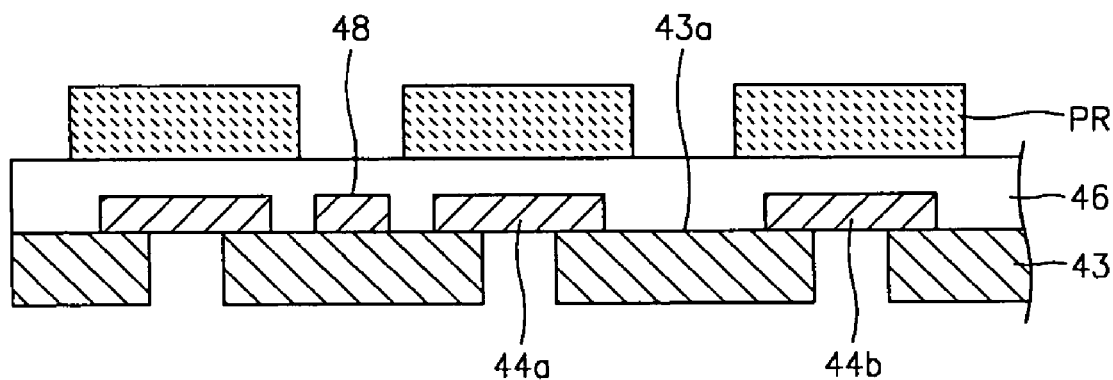
Figure 7:
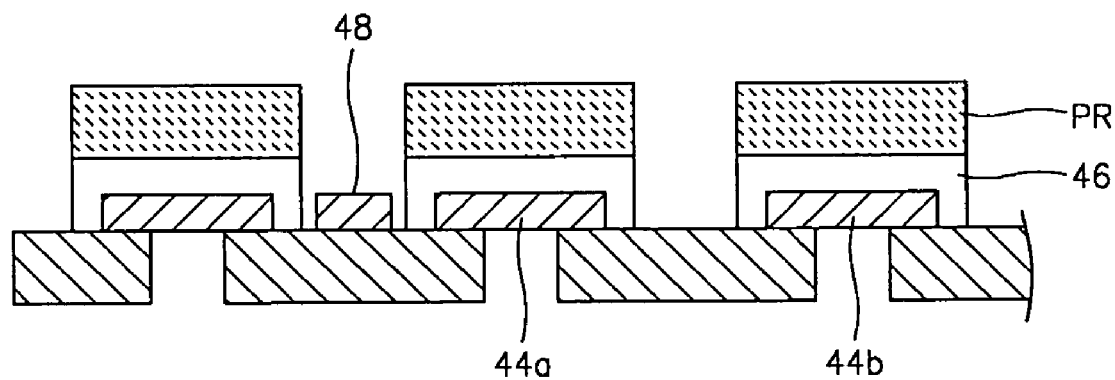

FIGS. 5 through 7 are enlarged cross-sectional views of a portion A of FIG. 2 for explaining an exemplary method of manufacturing BGA package 40 according to the first exemplary embodiment of the present invention. As illustrated in FIG. 5, the elastic insulating layers 46 are coated on the entire top surface 43a of the substrate 43 on which the bond fingers 48 and the conductive ball lands 44a and 44b are mounted. Openings 43_H that expose portion of the lower surfaces of conductive ball lands 44a and 44b are formed through the substrate 43. The bond fingers 48 and the conductive ball lands 44a and 44b are obtained by forming a layer of a metal such as Cu by sputtering, electrolytic plating, electroless plating, or a combination of these methods, and then patterning and etching the resulting metal layer to form the desired metal pattern.

A layer of an elastomer is then formed on the metal pattern, preferably using an elastomer having a low modulus of elasticity such as a silicone-based resin having a modulus of elasticity no greater than about 20 MPa. The elastic insulating layers 46 may be formed using various methods such as spin coating or spray coating methods, to form an elastomeric layer having a thickness between about 20 and about 100 μm for most typical device configurations.

As illustrated in FIG. 6, a photoresist pattern PR is then formed on the elastic insulating layers 46, typically using a conventional photolithographic process including coating, exposure, and development steps to expose those regions of the elastic insulating layer 46 that are to be removed. In particular, portions of the elastic insulating layer 46 above and adjacent the bond fingers 48 and predetermined areas of the top surface 43*a* between conductive ball lands 44*a* and 44*b* may be exposed when the photoresist pattern PR is formed.

As illustrated in FIG. 7, the exposed portions of the elastic insulating layers 46 are then etched using the photoresist pattern PR as an etching mask. Thus, the bond fingers 48 and predetermined regions of the surface 43*a* are exposed and the elastic insulating layers 46 on the conductive ball lands 44*a* and 44*b* are obtained. Once the elastic insulating layers 46 have been defined, the BGA package 40 shown in FIG. 2 may be completed using conventional methods and process known to those of ordinary skill in the art to mount the semiconductor chip 41 using adhesive 42, connect bond wires 49 between bonding pads 47 and bond fingers 48, mold the mold resin 50 and attach the solder balls 45.

Figure 8:
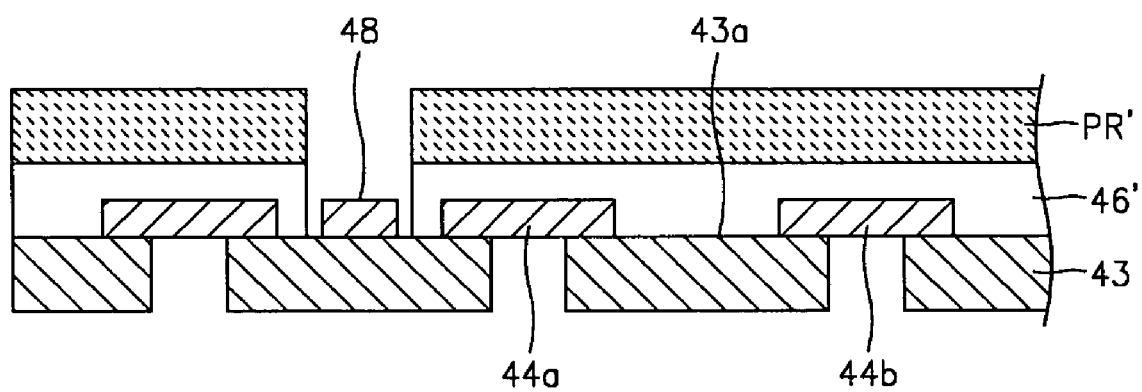
FIG. 8 is an enlarged cross-sectional view of a portion B of FIG. 3 for explaining a second exemplary method of manufacturing the BGA package according to the second exemplary embodiment as illustrated in FIG. 3.

FIG. 8 is an enlarged cross-sectional view of a portion B of FIG. 3 further illustrating an exemplary method of manufacturing the BGA package 40A according to the second exemplary embodiment of the present invention. As shown in FIG. 8, an elastic insulating layer 46' is formed on the entire top surface 43*a* of the substrate 43 on which the bond fingers 48 and the conductive ball lands 44*a* and 44*b* are formed. Thereafter, a photoresist pattern PR' for exposing the bond fingers 48 and predetermined surface regions adjacent the bond fingers is formed on the elastic insulating layer 46'. The exposed portions of the elastic insulating layer 46' is then removed and the BGA package 40A may be completed using the sequence of processes described above with regard to the formation of BGA package 40 according the first exemplary embodiment.

As described above, because the conductive ball lands disposed in both the fan-in and the fan-out positions are coated with elastic insulating layers in a BGA package according to the first and second exemplary embodiments of the present invention, even if the modulus of elasticity increases after the adhesive and mold resin are hardened due to the presence of the elastomer, the solder joint reliability (SJR) does not tend to be degraded when the resulting BGA package is mounted on a PCB.

Further, according to the exemplary embodiments of the present invention, because the potential breaking stress between solder balls and the conductive ball lands is absorbed and distributed by the elastic property of the elastic insulating layers, the solder ball joints exhibit improved resistance to breaking, shearing and cracking, thereby improving the yield and reliability of devices incorporating such BGA packages.

After reviewing this disclosure, those of ordinary skill in the art will appreciate that various changes to those exemplary embodiments of the invention disclosed herein may be made without departing from the spirit and scope of the invention as defined by the appended claims. For example, the portion of the top surface of the substrate that may be coated with the elastic insulating layers in addition to the conductive ball lands may be easily varied using an appropriate mask to coat substantially the entire surface or, at the other extreme, to coat essentially only the conductive ball lands. Similarly, although the exemplary embodiments utilize a bonding wire to form an electrical connection between the semiconductor chip bonding pads and the bond fingers, other means may be employed to form the desired electrical connections such as conductive bumps, metal patterns, conductive polymers or a combination of these methods. Further, although an epoxy mold resin as discussed in connection with the exemplary embodiments is typically used as an encapsulant, those of ordinary skill in the art will be able to select and utilize other types of encapsulants suitable for the intended application of the completed device.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A ball grid array package comprising:
   a substrate;
   a plurality of conductive ball lands formed on a top surface of the substrate;
   an elastic insulating layer formed on an upper surface of the conductive ball lands; and
   a plurality of solder balls formed on a bottom surface of the substrate, the solder balls being electrically connected to corresponding conductive ball lands through openings extending through the substrate.

2. The ball grid array package of claim 1, further comprising:
   a plurality of bond fingers formed on the top surface of the substrate;
   a semiconductor chip mounted on a predetermined region of the top surface of the substrate;
   a plurality of connection members forming an electrical connection between a bonding pad of the semiconductor chip to a corresponding bond finger; and
   a mold resin for encapsulating the semiconductor chip, the bond fingers, the conductive ball lands, and the connection members.

3. The ball grid array package of claim 1, wherein:
   the elastic insulating layer is formed from an elastomeric material having a modulus of elasticity not greater than about 20 MPa.

4. The ball grid array package of claim 1, wherein:
   the elastic insulating layer includes a silicone-based resin.

5. The ball grid array package of claim 1, wherein:
   the elastic insulating layer extends onto side surfaces of the plurality of conductive ball lands.

6. The ball grid array package of claim 2, wherein:
   the plurality of bond fingers include a region not covered by an elastic insulating layer.

7. The ball grid array package of claim 6, wherein:
   the plurality of bond fingers are substantially free of the elastic insulating layer.

8. The ball grid array package of claim 7, wherein:
   the predetermined region is substantially free of the elastic insulating layer.

9. The ball grid array package of claim 1, wherein:
   the elastic insulating layer has the thickness of from about 20 μm to about 100 μm.

10. The ball grid array package of claim 1, wherein:
the connection members include at least one connecting structure selected from a group consisting of bonding wires, metal bumps, metal film patterns and conductive polymers.

11. A method of manufacturing a ball grid array package comprising:
preparing a substrate;
forming conductive ball lands on a top surface of the substrate;
forming an elastic insulating layer on a first group of the conductive ball lands;
forming openings through the substrate to a lower surface of the conductive ball lands; and
forming solder balls on a bottom surface of the substrate, the solder balls being electrically connected to corresponding conductive ball lands through the openings.

12. A method of manufacturing a ball grid array package, comprising:
preparing a substrate;
forming bond fingers and conductive ball lands on a top surface of the substrate;
forming an elastic insulating layer on a first group of the conductive ball lands;
mounting a semiconductor chip on a predetermined region of the substrate;
forming connection members between bonding pads of the semiconductor chip and corresponding bond fingers;
forming openings through the substrate to expose portions of a lower surface of the conductive ball lands;
encapsulating the semiconductor chip, the bond fingers, the conductive ball lands and the connection members with a mold resin; and
forming solder balls on the bottom surface of the substrate, the solder balls being electrically connected to corresponding conductive ball lands through the openings.

13. The method of claim 11, wherein:
the elastic insulating layer is formed on the upper surfaces and side surfaces of the first group of the conductive ball lands.

14. The method of claim 13, wherein:
all of the conductive ball lands are included in the first group.

15. The method of claim 12, wherein:
the bond fingers are substantially free of the elastic insulating layer.

16. The method of claim 15, wherein:
the predetermined region is substantially free of the elastic insulating layer.

17. The method of claim 11, wherein:
forming the elastic insulating layer includes applying an elastomeric material to the top surface of the substrate using a method selected from a group consisting of spin coating and spray coating.

18. The method of claim 11, wherein:
forming the conductive ball lands includes:
forming a metal layer on the top surface of the substrate;
forming an etch pattern on the metal layer to expose predetermined regions of the metal layer; and
etching the metal layer to remove the predetermined regions of the metal layer.

19. A method of manufacturing a ball grid array package according to claim 1, comprising:
preparing the substrate;
forming the conductive ball lands on the top surface of the substrate;
forming the elastic insulating layer on a first group of the conductive ball lands;
forming the openings through the substrate to a lower surface of the conductive ball lands; and
forming the solder balls on the bottom surface of the substrate, the solder balls being electrically connected to corresponding conductive ball lands through the openings.

20. A method of manufacturing a ball grid array package according to claim 2, comprising:
preparing the substrate;
forming the bond fingers and the conductive ball lands on the top surface of the substrate;
forming the elastic insulating layer on a first group of the conductive ball lands;
mounting the semiconductor chip on the predetermined region of the substrate;
forming the connection members between the bonding pads of the semiconductor chip and the corresponding bond fingers;
forming the openings through the substrate to expose portions of a lower surface of the conductive ball lands;
encapsulating the semiconductor chip, the bond fingers, the conductive ball lands and the connection members with the mold resin; and
forming the solder balls on the bottom surface of the substrate, the solder balls being electrically connected to corresponding conductive ball lands through the openings.

* * * * *